(12) United States Patent
O'Connor et al.

(10) Patent No.: US 11,107,679 B2
(45) Date of Patent: Aug. 31, 2021

(54) METHOD OF PROCESSING A TARGET MATERIAL

(71) Applicant: National University of Ireland, Galway, Galway (IE)

(72) Inventors: Gerard O'Connor, Galway (IE); Nazar Farid, Galway (IE); Pinaki Das Gupta, Galway (IE)

(73) Assignee: National University of Ireland, Galway, Galway (IE)

(*) Notice: Subject to any disclaimer, the term of this patent is extended or adjusted under 35 U.S.C. 154(b) by 0 days.

(21) Appl. No.: 16/782,894

(22) Filed: Feb. 5, 2020

(65) Prior Publication Data
US 2020/0211844 A1    Jul. 2, 2020

Related U.S. Application Data

(63) Continuation of application No. PCT/EP2018/074649, filed on Sep. 12, 2018.

(30) Foreign Application Priority Data

Sep. 14, 2017   (GB) ..................... 1714802

(51) Int. Cl.
*H01L 21/02*     (2006.01)
*H01L 21/268*    (2006.01)

(52) U.S. Cl.
CPC .. *H01L 21/02686* (2013.01); *H01L 21/02532* (2013.01); *H01L 21/02565* (2013.01); *H01L 21/268* (2013.01)

(58) Field of Classification Search
None
See application file for complete search history.

(56) References Cited

U.S. PATENT DOCUMENTS

| 7,923,317 B2 | 4/2011 | Bouchut |
| 2004/0235276 A1 | 11/2004 | Lin |

(Continued)

FOREIGN PATENT DOCUMENTS

| EP | 1758155 | 2/2007 |
| EP | 2833391 | 2/2015 |
| JP | 2014/090045 | 5/2014 |

OTHER PUBLICATIONS

Chen et al., Microstructural Characteristics of InGaZnO Thin Film Using an Electrical Current Method, Materials Transactions, vol. 53, No. 4, pp. 733 to 738, 2012.

(Continued)

*Primary Examiner* — Bo B Jang
(74) *Attorney, Agent, or Firm* — Levine Bagade Han LLP

(57) ABSTRACT

Methods of processing a target material are disclosed. In one arrangement, a multilayer structure is irradiated with a radiation beam. The multilayer structure comprises at least a target layer comprising the target material and an additional layer not comprising the target material. The additional layer is metallic. The target layer is irradiated through the additional layer during the irradiation of the multilayer structure. A transfer of energy from the radiation beam to the target layer and to the additional layer is such as to cause a thermally-induced change in the target layer. The thermally-induced change comprising one or more of: crystal growth in the target material, increased carrier mobility in the target material, increased chemical stability in the target material, and increased uniformity of electrical properties in the target material.

17 Claims, 5 Drawing Sheets

(56) References Cited

U.S. PATENT DOCUMENTS

| | | |
|---|---|---|
| 2007/0063184 A1 | 3/2007 | Ogawa et al. |
| 2007/0134892 A1 | 6/2007 | Chen et al. |
| 2009/0127560 A1 | 5/2009 | Park et al. |
| 2009/0130795 A1 | 5/2009 | Im |
| 2010/0075487 A1* | 3/2010 | Bouchut ................ C30B 29/16 438/487 |
| 2017/0025541 A1 | 1/2017 | Ye |

OTHER PUBLICATIONS

Solis et al., Existence of Electronic Excitation Enhanced Crystallization in GeSb Amorphous Thin Films upon Ultrashot Laser Pulse Irradiation, Physical Review Letters, vol. 76, No. 14, 1996.

Yang et al., Characteristic Enhancement of Solution-Processed In—Ga—Zn Oxide Thin-Film Transistors by Laser Annealing, IEEE Electron Device Letters, vol. 31, No. 9, Sep. 2010.

* cited by examiner

Fig. 3
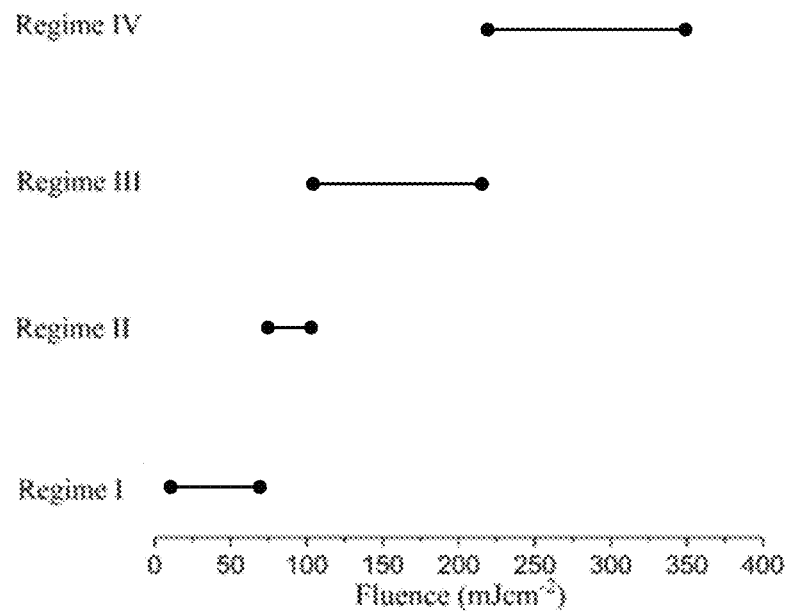
Fig. 4A
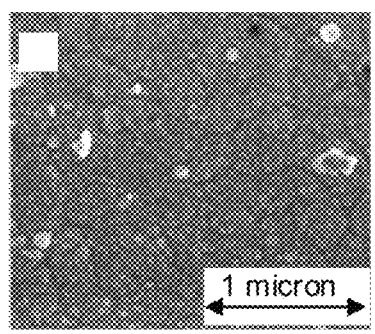
Fig. 4B                Fig. 4C
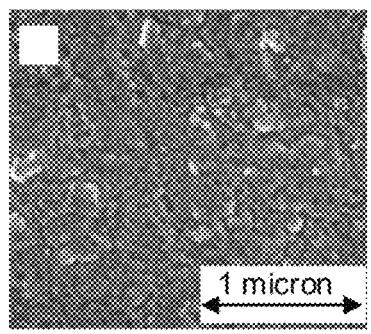     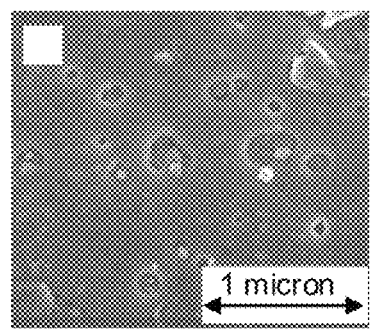

METHOD OF PROCESSING A TARGET MATERIAL

CROSS-REFERENCE TO RELATED APPLICATIONS

This application is a continuation of International Patent Application Number PCT/EP2018/074649 filed Sep. 12, 2018, which claims the benefit of United Kingdom Patent Application Number GB 1714802.4 filed Sep. 14, 2017, the contents of which are incorporated herein by reference in their entireties.

BACKGROUND

The invention relates to processing a target material to cause a thermally-induced change in the target material, such as crystal growth or improved uniformity. The invention is particularly relevant to processing semiconductor materials during fabrication of electronic devices such as displays, but is applicable to other materials.

It is known to process metallic or semiconductor materials to promote crystal growth and thereby improve electrical properties. Increasing the size of crystallites, for example, typically increases carrier mobility (and thereby reduces electrical resistivity) due to material becoming closer to a perfectly regular single crystal. Techniques for driving crystal growth need to provide energy to drive repositioning of atoms by atomic diffusion and/or to nucleate a crystalline phase where none existed previously. Such techniques may also need to maintain other properties during the processing, such as transparency (in the case of displays or PV applications for example).

Polycrystalline silicon (poly-Si) is used in large area electronics as the active and/or doped layers in thin-film transistors. Poly-Si may be used for example in TFTs of a display such as an LCD or AMOLED. A TFT consists of a source, drain and gate. When integrated on a display device, the poly-Si gate material must be highly conductive. Another application is in photovoltaic (PV) cells, where highly crystalline, highly transparent, layers are required to extract photo-generated charges efficiently.

The poly-Si can be formed by solid-phase crystallization of amorphous silicon (a-Si) where the substrate (e.g. glass) can support the relatively high temperatures involved (at least 300° C.). For other substrates, such as the plastic substrates that may be needed for manufacturing digital displays on flexible screens, or where other temperature sensitive components are present in the vicinity of the a-Si to be crystallized, different techniques are needed.

One recently developed approach is laser crystallization, which uses short, high intensity UV laser pulses to heat the a-Si above the melting point of silicon without melting or damaging the substrate and/or any surrounding temperature sensitive components. This process incorporates processes known as super lateral growth (SLG) and sequential lateral solidification (SLS). The laser pulse is absorbed by the material, resulting in a change in phase by heating from an amorphous solid to a molten state, followed by rapid cooling to form a polycrystalline material. The duration of the laser pulse and size of the heat affected zone must be controlled carefully. The temperature of amorphous material must be increased significantly to enable nucleation of crystal domains. For example, a-Si has a crystallization enthalpy of about 11.95 kJ/mol, with reported "bulk" crystallization temperatures in the range of 600 to 800° C. SLG and SLS are processes that have been optimized to create this localized temperature and to establish directional crystals on rapid cooling. By controlling the cooling of the molten silicon it is possible to form poly-Si with a controllable range of crystallite sizes.

For many years excimer laser sources have been used to improve the crystallinity of poly-Si materials (or convert a-Si to poly-Si). The lasers operate at 308 nm in the UV so as to couple energy into the silicon, which is transparent at visible wavelengths. Long line beams (e.g. 750 mm×0.030 mm) are used. The long line beam is to ensure that large area displays (TVs, public screen etc) can be covered at the highest speed up to "Generation 10" (G10) sheets (2880 mm×3130 mm). Excimer lasers have a low repetition rate (300-600 Hz) and to effectively implement the re-crystallisation of the order of 20 laser pulses are typically required at each location. This limits the speed of processing. The uniformity of the beams also needs to be kept high to ensure that each transistor is annealed to the same extent. There can be about 1 billion TFT transistors dispersed throughout a typical G10 panel.

Heat retention layers may be included to assist excimer-based laser-induced crystallization processes. Such heat retention layers comprise dielectric materials such as oxides and nitrides of silicon. They are deposited adjacent to the amorphous layer which is to be crystallised. The heat retention layers have a thickness typically of the order of one micron or greater. The heat retention layers remain attached to the material throughout the duration of the laser induced crystallization process. A patterned dielectric layer, acting as a heat retention layer, may be used to preferentially assist the laser-induced crystallization process where the dielectric layer is directly adjacent to the layer which is to be crystallised. A dielectric layer is used because it is thought that metallic layers would inhibit the crystallization process in this context.

Alternative techniques using multimode green lasers operating at 10 kHz have been proposed as lower cost alternatives to excimer lasers, but these have not yet been adopted widely in the industry.

An alternative approach is metal-induced crystallization (MIC), which allows an a-Si thin film to be crystallized at temperatures as low as 140° C. by annealing the a-Si while it is in contact with a metal film such as aluminium, gold or silver, which acts as a catalyst for the crystallization process. The annealing required for an MIC process is generally applied macroscopically and maintained for a much longer time than the heating associated with laser crystallization. The annealing is not performed using a laser.

MIC generally involves: 1) bond weakening of the amorphous material at the interface with the metal, which enhances the mobility of amorphous atoms at the interface; 2) interface effects providing fast, short-circuit diffusion pathways for transportation of the amorphous atoms; and 3) interface thermodynamics, which further favour crystal growth at interfaces.

There are two types of MIC processes which exist currently for a-Si.

The first of these MIC processes occurs for example where crystalline aluminium is used as the catalyst layer on a-Si. Silicon atoms preferentially wet interfaces with high angle grain boundaries of the aluminium at temperatures above 140° C. Si crystallization is nucleated when a critical thickness of the wetted a-Si layer is reached. A compressive stress arises in the aluminium layer and a tensile stress arises in the a-Si layer. As the tensile material has space to accommodate more atoms, this gradient in stress drives a diffusion process which results in aluminium grains from the aluminium layer being dissolved in the a-Si layer. As these aluminium plumes develop in the a-Si they experience a convective force which ensures they propagate towards the surface. This effect gives rise to solid state layer exchange that results in a crystalline silicon phase being formed below the metal. All steps in the process are enabled at a low temperature.

The second of the MIC processes leads to a metal semiconductor compound being formed with a minimal lattice mismatch to the surrounding area. As an example, on heating a nickel layer on an a-Si layer, $NiSi_2$ is formed at the crystalline nickel a-Si interface. Crystalline silicon precipitates from the $NiSi_2$ phase and migrates into the a-Si material. This results in needle-like crystal structures of crystalline Si being formed. The more the process is seeded at the crystal interface, the more crystalline material is formed.

SUMMARY

It is an object of the invention to provide alternative techniques for processing target materials to effect desired thermally-induced changes in the target materials, such as increases in crystallinity.

According to an aspect of the invention, there is provided a method of processing a target material, comprising: irradiating a multilayer structure with a radiation beam, the multilayer structure comprising at least a target layer comprising the target material and an additional layer not comprising the target material, wherein: the additional layer is metallic; the target layer is irradiated through the additional layer during the irradiation of the multilayer structure; and a transfer of energy from the radiation beam to the target layer and to the additional layer is such as to cause a thermally-induced change in the target layer, the thermally-induced change comprising one or more of: crystal growth in the target material, increased carrier mobility in the target material, increased chemical stability in the target material, and increased uniformity of electrical properties in the target material.

Thus, a method is provided which allows thermally-induced changes to be driven efficiently in selected regions of a target material, with minimal or no impact to other regions of the target material and/or surrounding layers or nearby device structures. Time and energy costs are lower in comparison with alternative approaches in which the entire layer of target material is processed at the same time (e.g. by scanning an excimer laser over the surface). The thermally-induced changes may comprise any combination of crystal growth, increased carrier mobility, increased chemical stability, and increased uniformity of electrical properties. The inventors have found that the metallic nature of the additional layer promotes the thermally-induced changes (e.g. crystal growth). This was somewhat surprising given that in the context of excimer-based laser-induced crystallization metallic layers are thought to inhibit crystallization.

Without wishing to be bound by theory, it is thought that the distribution of electrons in the target layer is modified by the emission of electrons from the surface of the metallic additional layer to the ambient through photoelectric and thermionic emission following the irradiation. The charge imbalance which results following such emission temporarily alters the electron density in both additional and target layers and thereby temporarily affects (e.g. reduces) the bond strength of the constituent atoms in the target layer. The temporary effect on the bond strength assists with one or more of crystal growth in the target material, increased carrier mobility in the target material, increased chemical stability in the target material, and increased uniformity of electrical properties in the target material. The charge neutrality of the thin multilayer structure is restored through its connection to an electrical path to ground and through its surface via the interaction with suspended ions and electrons impacting the multilayer structure from the ambient.

The method is particularly applicable to forming poly-Si from a-Si selectively in TFT gate regions of large area electronic arrangements using for manufacturing displays, as well as in PV based devices. The method allows crystallinity to be increased with minimal or no impact to transparency. The method is also compatible with roll-to-roll or sheet-to-sheet high volume manufacturing platforms using flexible substrates, due to the very low thermal load applied to the substrate. Plastic substrates can be used without risk of melting or damage.

The method is also applicable to other transparent conductive materials, for example for displays. The thermally-induced change in this context may comprise local crystallization, which may improve carrier mobility.

The method is particularly applicable to promoting crystallization, improving carrier mobility, improving uniformity, and/or improving chemical stability, of indium gallium zinc oxide (IGZO). The method is also applicable to the crystallisation of other dielectrics such as metal oxides in thin film battery technologies.

The method is also applicable to reducing the resistance of metallic tracks, such as tracks formed using nanoparticle inks or other simple low temperature deposition processes. The grain size of deposited metals can be increased by matching the frequency of the radiation beam to the resonant plasmon frequency of the nanoparticle ink or grain size of the deposited metal. Efficiency can be improved by providing a well-defined particle size distribution.

In an embodiment, the irradiation of the multilayer structure causes detachment of at least an irradiated portion of the additional layer from the target layer after the thermally-induced change in the target layer (e.g. crystal growth) has occurred. Thus, the additional layer spontaneously detaches from the target material, after it has served its purpose of promoting thermally-induced change in the target material, without any additional processing steps being required.

In an embodiment, a fluence of the radiation beam is selected such that the thermally-induced change (e.g. crystal growth) in the target layer is achieved without any portion of the target layer entering a molten phase during the irradiation by the radiation beam. The avoidance of the molten state improves the quality of the crystal growth in the target material, favouring development of a uniform distribution of small grains.

In an alternative embodiment, the fluence of the radiation beam is selected such that at least a portion of the target layer does enter the molten state during at least a portion of the irradiation by the radiation beam. Entry into the molten state enables larger crystallites to be formed where this is desirable.

In an embodiment, the target layer and the additional layer are configured such that energy from the laser radiation is transferred from the electrons of the additional layer to the lattice of the target material more quickly than energy from the laser radiation is transferred from the electrons of the additional layer to the lattice of the additional layer. This effect favours effective incubation of the target layer by the additional layer during the thermally-induced change (e.g. crystal growth). The subsequent thermalisation of the energy stored in the electron system of the additional material to the lattice of the additional material may conveniently cause detachment of the additional layer from the target layer after the thermally-induced change has occurred.

BRIEF DESCRIPTION OF THE DRAWINGS

The invention will now be further described, by way of example, with reference to the accompanying drawings, in which:

FIG. 3 depicts ranges of different Fluence Regimes;

FIGS. 4A-4C depict SEM images of Si after no processing (see FIG. 4A) and after processing by irradiation in different Fluence Regimes (see FIGS. 4B-4C);

DETAILED DESCRIPTION

Embodiments of the present disclosure relate to processing a target material to cause a desired thermally-induced change in the target material. The thermally-induced change typically involves crystal growth in the target material. The crystal growth may lead to conversion of an amorphous material to a polycrystalline material. Alternatively, the crystal growth may lead to an increase in the average size of crystallites in a target material that was already polycrystalline before the processing.

In an embodiment the crystal growth is such as to reduce the resistivity, or increase the mobility of charge carriers, in the target material by reducing scattering from irregularities in the target material, such as grain boundaries or other deviations from perfect lattice periodicity.

The thermally-induced change may comprise one or more of the following in any combination: crystal growth in the target material, increased carrier mobility in the target material, increased chemical stability in the target material, and increased uniformity of electrical properties in the target material.

Figure 1:
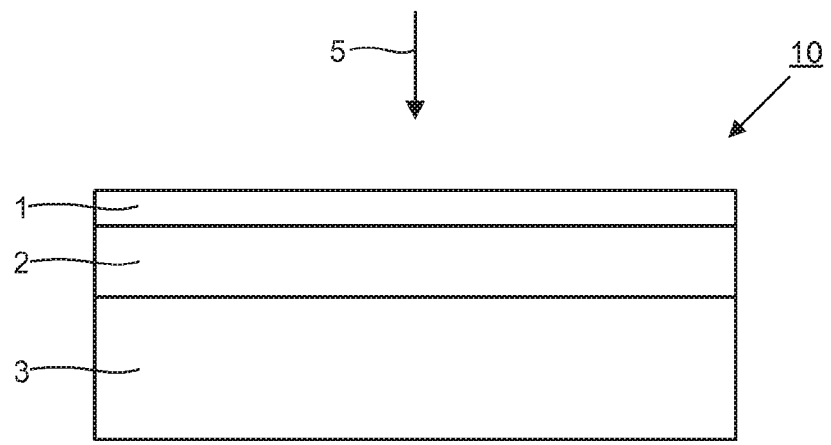
FIG. 1 schematically depicts irradiation of a multilayer structure according to an embodiment.

As depicted schematically in FIG. 1, the method comprises irradiating a multilayer structure 10 with a radiation beam 5. The multilayer structure 10 comprises at least a target layer 2 and an additional layer 1. The additional layer 1 is metallic. The target layer 2 comprises, consists essentially of, or consists of, the target material. The additional layer 1 does not comprise the target material. The target layer 2 is irradiated through the additional layer 1 during the irradiation of the multilayer structure 10. Thus, the radiation beam 5 passes partially through the additional layer 1 to reach the target layer 2. Energy from the radiation beam 5 is deposited in the additional layer 1 and in the target layer 2.

In the embodiment shown the multilayer structure 10 comprises a stack comprising the target layer 2 and the additional layer 1 on a substrate 3. In an embodiment, the substrate 3 is a flexible substrate, for example formed from a plastic or a glass or a ceramic. The substrate 3 may, for example, be configured to be compatible with a roll-to-roll or sheet-to-sheet manufacturing process. One or more further layers may be provided as needed, including one or more layers on top of the additional layer 1, between the additional layer 1 and the target layer 2, and/or between the target layer 2 and the substrate 3.

The radiation beam 5 and multilayer structure 10 are configured (e.g. by appropriate selection of fluence and/or pulse length in the case of the radiation beam and/or by appropriate selection of materials and layer thicknesses in the case of the multilayer structure 10) such that a transfer of energy from the radiation beam 5 to the target layer 2 and to the additional layer 1 is such as to cause the desired thermally-induced change in the target material (e.g. crystal growth).

The inventors have found that under particular ranges of fluence the additional layer 1 incubates the target layer 2 and prolongs a period during which the temperature of the target material is high enough to promote thermally induced change, such as crystal growth (via solid state diffusion of atoms in the heated lattice) while at the same time allowing the peak rate of energy transfer to be kept low enough to avoid any melting of the target material during the irradiation. It is normally desirable to avoid melting because this can have a negative effect on the quality of crystalline material produced in the target layer 2 (where the aim is to promote crystallization). For example, where melting occurs a polycrystalline structure having a sub-optimal distribution of crystallite sizes can be produced, including for example excessively large crystallites which can cause non-uniformities in structural and/or electronic properties. In other embodiment, however, desired thermally-induced changes may benefit from entry into the molten phase, in which case a fluence of the radiation beam may be selected such that at least a portion of the target layer enters the molten state during at least a portion of the irradiation by the radiation beam.

Without wishing to be bound by theory, it is thought that the radiation beam is partially absorbed by the electrons in the material of the additional layer 1. This absorption creates ballistic electrons in the additional layer 1. The excited electrons remain ballistic until they undergo scattering. Electrons can scatter elastically or inelastically with other electrons or with the lattice ions. In embodiments of the present disclosure, the thickness of the additional layer 1 is chosen to enable ballistic electrons to propagate to the interface between the additional layer 1 and target layer 2. In an embodiment, the additional layer 1 has a thickness of less than 200 nm, optionally less than 150 nm, optionally less than 100 nm, optionally a thickness in the range of 20-70 nm.

In cases where the excited electrons undergo elastic scattering in the additional layer 1 their direction is changed but the energy they carry remains the same. In cases where the excited electrons undergo inelastic scattering with other electrons in the additional layer 1, the ballistic electrons transfer energy to other electrons creating a hot electron gas in the additional layer 1 characterised by an electron temperature.

The resulting hot electron gas diffuses throughout the additional layer 1 before it couples to the lattice of the additional layer 1. The material of the additional layer 1 and the laser parameters are selected to ensure that this time frame is relatively long (e.g. 3-50 picoseconds). Once the electrons couple to the lattice the lattice of the additional layer 1 heats and an elevated lattice temperature is generated.

The heated electrons in the additional layer 1 exchange energy with the target material. The electron energy can be thought of as a wave which partially reflects and transmits through the interface between the additional layer 1 and the target layer 2. The excited or heated electrons in the additional layer 1 exchange energy with the target material at the interface between the two materials in a number of ways. The laser excited ballistic electrons can penetrate into the target material and exchange energy with the target material's electronic and lattice sub-systems through electron-electron scattering, impact ionisation and electron lattice coupling. Depending on the electronic band-structure at the interface, hot electrons in the additional layer 1 can interact with the electrons and lattice sub-systems of the target material by electron-electron scattering and electron-phonon coupling at the interface. Finally, the lattice of the heated additional layer 1 can also couple energy to the lattice of the target material through phonon-phonon coupling at the interface.

The radiation beam is also partially transmitted through the additional layer 1 to the target layer 2. The radiation beam thus also directly heats electrons in the target material. The electrons thus heated or exchanged between layers transfer energy to the lattice of the target material.

This transfer of energy from the electrons to the lattice occurring at the interface or in the target material ideally occurs in the target material before it occurs in the additional layer 1. Thus, energy from the laser radiation is transferred from the electrons of the additional layer 1 to the lattice of the target material more quickly than energy from the laser radiation is transferred from the electrons of the additional layer 1 to the lattice of the additional layer 1. When heat finally reaches the lattice of the additional layer 1, the additional layer 1 desirably detaches spontaneously from the rest of the multilayer structure 10.

The additional layer 1 temporarily incubates the heated lattice of the target material while the additional layer 1 is present on the multilayer structure 10. Any incubation is limited in time due the detachment of the additional layer 1 which takes place within 1 microsecond to 1 millisecond after the laser pulse is incident on the multilayer structure.

At very low fluence (referred to herein as Fluence Regime I), the additional layer 1 is eventually heated enough that it detaches from the multilayer structure 10, but the heating is not sufficient to cause significant growth of crystals in the target material in the meantime, even with the incubation effect mentioned above.

At higher fluence (referred to herein as Fluence Regime II), the combination of direct absorption of the radiation beam by the target material and incubation by the additional layer 1 provides a temperature profile over time in the lattice of the target material suitable for the desired thermally-induced change (e.g. crystal growth) to occur without melting of the target material. The energised lattice of the target material is insufficient to disrupt the additional layer 1 at this stage (where the lattice of the additional layer 1 is still relatively cold), so the additional layer 1 remains in contact with the multilayer structure 10 and continues to incubate. This effect is facilitated by selection of the target material and the material of the additional layer 1 such that energy from the laser radiation is transferred from the electrons of the additional layer 1 to the lattice of the target material more quickly than energy from the laser radiation is transferred from the electrons of the additional layer 1 to the lattice of the additional layer 1. This is the case for example where the target material comprises a-Si and the material of the additional layer 1 comprises a metal, such as Mo.

At higher fluence (referred to herein as Fluence Regime III), the coupling of electronic energy to the lattice of the additional layer 1 occurs over a shorter timescale which results in the heating of the lattice of the additional layer 1 being faster than that observed at lower fluences. This impacts the transfer of electronic energy from the additional layer 1 to the target layer 2 and thereby limits the formation of a desired thermally-induced change (e.g. a crystalline phase), for example to an outer annulus of a radiation beam in the case where a Gaussian beam is used for the radiation. The additional layer 1 separates from the multilayer structure 10 too quickly, reducing the electron diffusion and incubation effects discussed above.

At still higher fluence (referred to herein as Fluence Regime IV), the additional layer 1 is photomechanically disrupted as in Regime III but the applied fluence also melts the target material, which as discussed above can lead to suboptimal crystallization in the target material.

The dependence of the crystal growth mechanism on fluence is exemplified in the experimental results depicted in FIGS. 2A-2F.

Figure 2A:
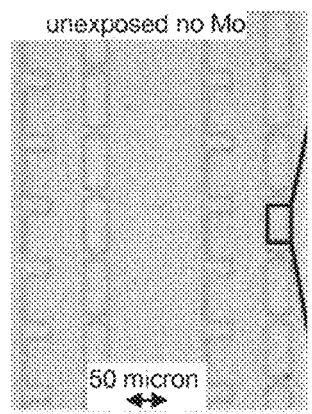
FIGS. 2A-2F are optical microscopy images of a TFT pattern (see FIG. 2A) and magnified views of a gate region at different stages of processing by irradiation (see FIGS. 2B-2F)
Figure 2B:
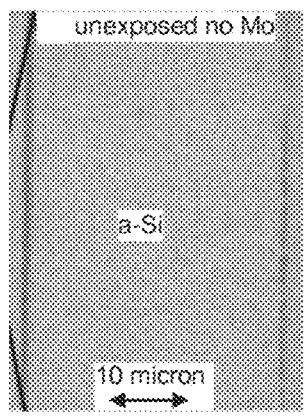

FIG. 2A depicts an optical microscopy image of a TFT pattern comprising gate regions. FIG. 2B depicts a magnified microscopy image of a region corresponding to one of the gate regions after a target layer comprising a-Si has been applied over the gate region. FIGS. 2C-2F depict the region of FIG. 2B after an additional layer (comprising Mo) has been applied as a coating on the target layer and, subsequently, the resulting multilayer structure has been processed by a Gaussian radiation beam spot at different fluencies.

In this example the additional layer consisted of a 40 nm thick layer of Mo deposited by magnetron sputtering. The Gaussian radiation beam spot was produced using a pulsed femtosecond laser delivering 500 fs pulses at a wavelength of 1030 nm. The laser was focused on the sample with 100 mm focal length lens (NA=0.014) of a scanning system. The scanning system was coupled to a machining stage (for accurate sample positioning) through a combination of reflectors and mirrors. A galvanometer based beam scanning system was used to scan the laser beam spot by adjusting the speed of steering mirrors. The laser was operated at maximum power and attenuated using a combination of half-wave plate and polarizer to keep the optimal beam shape and get higher pulse to pulse stability.

Figure 2C:
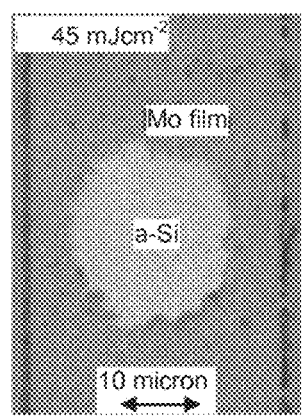

FIG. 2C depicts the result of irradiation at a fluence of 45 mJcm$^{-2}$ (the peak fluence associated with the Gaussian beam spot). The fluence is high enough to cause detachment of the additional layer (Mo) in a central region of the beam spot. The additional layer remains in place elsewhere. The fluence is not high enough to cause conversion of the a-Si to poly-Si anywhere. FIG. 2C thus depicts Fluence Regime I in the region where the additional layer detaches.

Figure 2D:
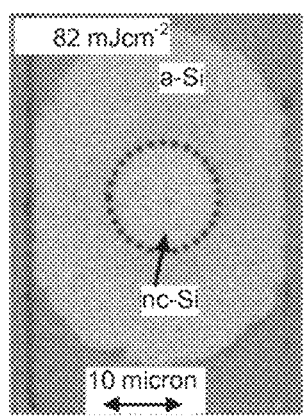

FIG. 2D depicts the result of irradiation at a fluence of 82 mJcm$^{-2}$ (the peak fluence associated with the Gaussian beam spot). The fluence in this case causes detachment of the additional layer (Mo) over a larger region. Additionally, in a central region (where the fluence is largest within the beam spot) crystal growth is promoted in the a-Si, leading to formation of a nanocrystalline form of poly-Si (ns-Si). In regions outside of the central region the fluence is too low to form nc-Si and a-Si is observed. The region where ns-Si is observed corresponds to a region where the fluence was in Fluence Regime II and incubation by the additional layer 1 was effective to cause crystal growth in the target material.

Figure 2E:
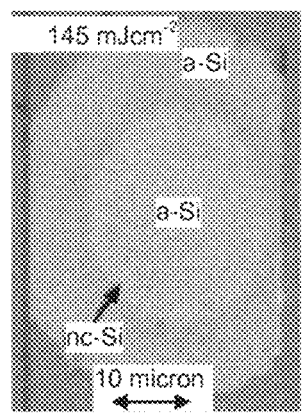

FIG. 2E depicts the result of irradiation at a fluence of 145 mJcm$^{-2}$ (the peak fluence associated with the Gaussian beam spot). In this case, the fluence in the central region (corresponding to Fluence Regime III) is high enough to alter the rate at which the electron energy is coupled to the lattice in the additional layer; the rate of energy coupling is increased which means the additional layer is heated at a similar rate to the target layer. This heating distorts the additional layer and modifies its optical and electronic properties in the central part of the beam. However, nc-Si is formed in an annular region around the central region corresponding to a region where the fluence was in Fluence Regime II. Outside of the annular region of nc-Si the fluence drops below the level necessary to form nc-Si (corresponding to Fluence Regime I), and a-Si is again observed in an outer annular ring.

Figure 2F:
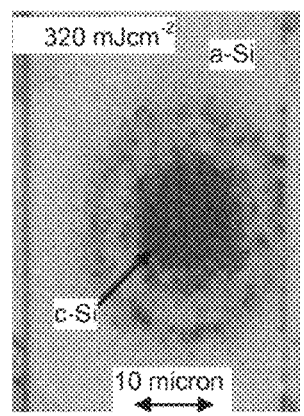

FIG. 2F depicts the result of irradiation at a fluence of 320 mJcm$^{-2}$ (the peak fluence associated with the Gaussian beam spot). In this case, the fluence is so high that it causes melting of the a-Si in a central region (where the fluence was in Fluence Regime IV), leading to formation of a microcrystalline silicon phase (c-Si).

FIG. 3 depicts ranges of fluence corresponding to the four Fluence Regimes for the example implementation in which the target layer 2 comprises a-Si and the additional layer 1 comprises Mo.

FIGS. 4A-4C depict SEM images of unexposed a-Si in a gate-like region (see FIG. 4A), nc-Si produced by applying a relatively low energy pulse (in Fluence Regime II) through an additional layer 1 comprising Mo (see FIG. 4B), and c-Si produced by melting and re-solidifying Si by applying a higher energy pulse (in Fluence Regime IV) (see FIG. 4C).

Figure 5:
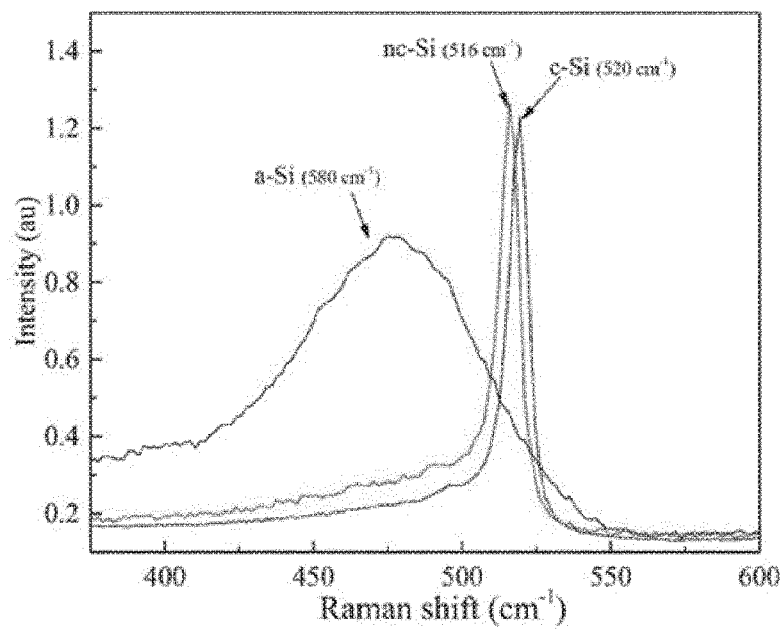
FIG. 5 depicts Raman spectra for a-Si, nc-Si, and c-Si.

FIG. 5 depicts Raman spectra of an a-Si layer, an nc-Si region, and a c-Si region. The nc- and c-Si regions were produced using a single pulse lying in Fluence Regimes II and IV respectively.

Figure 6:
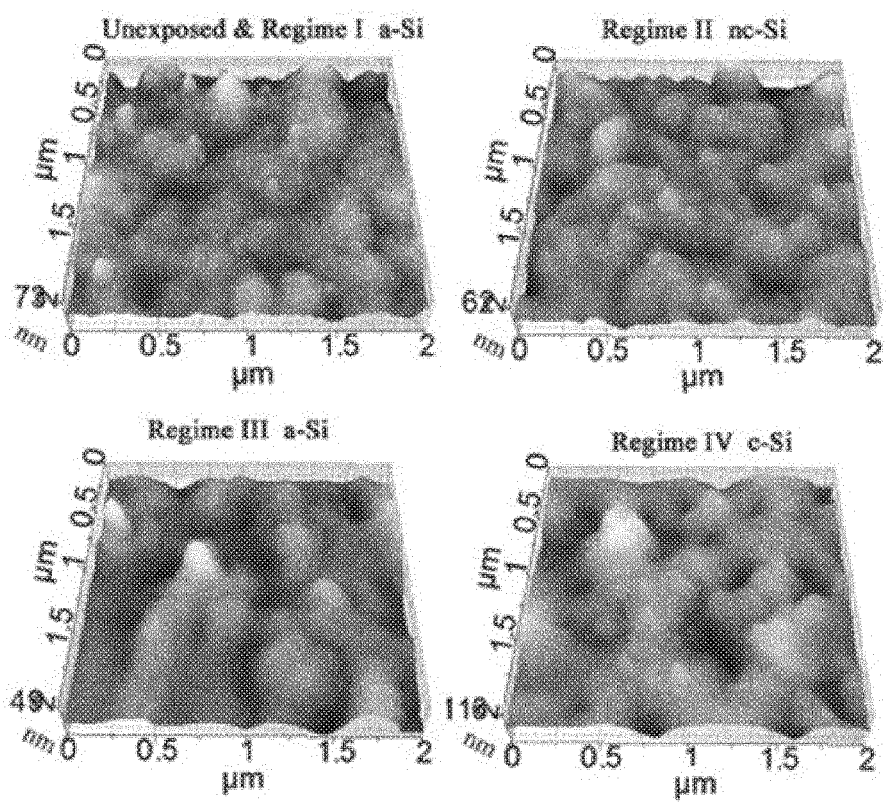
FIG. 6 depicts AFM images of silicon material after processing in each of four Fluence Regimes.

FIG. 6 depicts AFM images of silicon material after processing in each of the four Fluence Regimes. Fluence Regime II provides a desirable fine grained uniform distribution of crystallites. Fluence Regime IV provides large crystallites but less uniformity.

FIGS. 2A-2F, 3, 4A-4C, 5, and 6, discussed above, illustrate experimental results obtained with a-Si as the target material and Mo as the additional layer. The method is applicable to other combinations of materials. The other materials may comprise one or more of the following: a transparent conductive material; a dielectric material; a metal; a metal oxide; IGZO.

Figure 7A:
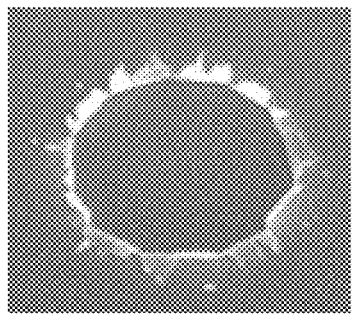
FIGS. 7A-7D depict images illustrating processing of a multilayer structure comprising Al as a target material and Mo as an additional layer.
Figure 7B:
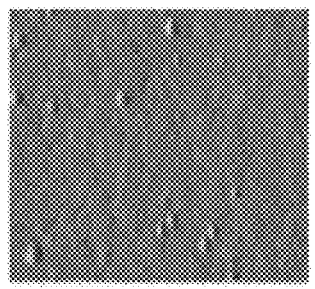
Figure 7C:
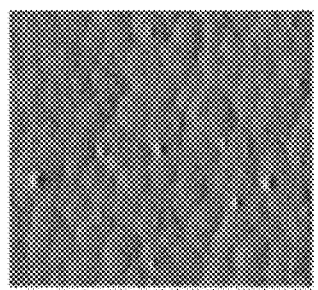
Figure 7D:
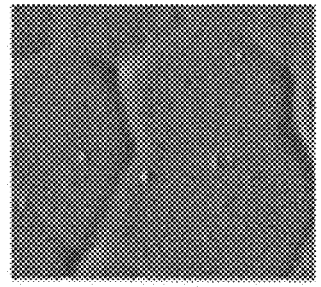

FIGS. 7A-7D depict the result of applying the processing to a multilayer structure comprising Al as the target material and Mo as the additional layer. FIG. 7a depicts selective removal of the Mo without apparent damage to underlying Al film. FIGS. 7B-7D are AFM images showing crystal growth in the underlying Al at progressively increasing fluencies, respectively 0.4 Jcm$^{-2}$, 0.8 Jcm$^{-2}$, and 1.4 Jcm$^{-2}$. FIGS. 7B-7C depict fine grained crystal growth arising under Fluence Regime II without any melting of the Al occurring. FIG. 7D depicts large grains resulting from melting of the Al at high fluence (Fluence Regime IV).

In embodiments of the present disclosure, the irradiation of the multilayer structure 10 causes detachment of at least an irradiated portion of the additional layer 1 from the target layer 2 after the thermally-induced change (e.g. crystal growth) in the target layer 2 has occurred. The detachment may occur because the additional layer 1 is not well adhered to the target layer 2 in the first place (e.g. because the additional layer 1 and the target layer 2 have different crystal structures and do not mix). Alternatively or additionally, when the radiation beam heats the electrons in the additional layer 1 and this in turn heats the lattice of the additional layer, the lattice of the additional layer 1 will want to expand but is restrained by the target layer 2 (i.e. there is differential thermal expansion). Compressive stress builds up and the material of the additional layer 2 fractures. The detachment is convenient because it avoids the need for separate processing to remove the additional layer 1. The detachment may be facilitated by appropriate selection of the material of the additional layer 1. Detachment will be favoured by choosing the material of the additional layer 1 such that it has thermal properties that are significantly different from those of the target material and/or any layers below the target material in the multilayer structure 10, for example significantly different electron-phonon coupling (e.g. with the additional layer having a longer electron-phonon coupling time), melting temperature, expansion coefficient, and/or emissivity. Alternatively or additionally, detachment may be favoured by choosing the material of the additional layer 1 such that it has significantly different mechanical properties than the target material (e.g. significantly different thermal expansion coefficient, lattice constant). Alternatively or additionally, the additional layer 1 is of a material that forms a crystalline structure of different symmetry and/or significantly different lattice parameters than the target material at room temperature and pressure. For example, in the case where the target material comprises silicon, which forms a diamond-like structure (comprising interpenetrating fcc structures), the additional layer 1 may be formed from a material that adopts a bcc structure at room temperatures and pressures (such as Mo). Alternatively or additionally, the additional layer 1 is applied in such a way that it only loosely adheres to the multilayer structure 10, for example using evaporation or sputtering. Alternatively or additionally, the material of the additional layer 1 may be chosen such that it does not mix with the target material in the target layer 2 or with any other layer below the target layer 2 in the multilayer structure 10.

The additional layer 1 still contributes to thermally-induced change (e.g. crystal growth) in the target material despite being removed because of the time scales of the processes involved. The incubation is performed before the additional layer 1 detaches.

The radiation beam may be a pulsed laser beam. In an embodiment, a single pulse of the radiation beam is capable of causing the crystal growth in the target material. More than one pulse of radiation could, however, be applied to a given region of the target material if desired. Multiple pulses could allow further control of the crystallisation process. In a particular embodiment, a plurality of pulses are applied to each region of the target material where crystal growth is to be promoted, wherein, in each said region, a first pulse causes crystal growth and a later pulse causes further crystal growth. In another embodiment, a second timed laser pulse may be used to further energise an excited electron in a target when transferred from the additional layer to a target material consisting of a semiconductor or dielectric, for instance.

In an embodiment, the laser pulse duration is less than 1 ns, optionally less than 100 ps, optionally less than 50 ps, optionally less than 10 ps, optionally less than 1 ps, optionally less than 100 fs, optionally less than 50 fs. Typically, for example, pulse durations in the 10s of picoseconds or 10s of femtoseconds may be used.

In an embodiment, the radiation beam comprises laser radiation in the IR, visible or UV spectra.

The distribution of grain sizes present in the target material after processing by the method depends on the properties of the radiation beam used to irradiate the multilayer structures (particularly the fluence and duration of each pulse that is applied, and the number of pulses). As mentioned above, relatively small grains are desirable to achieve uniform mechanical and/or electrical properties. In embodiments, the grain size distribution is controlled so that an average grain size (defined as the cube root of the grain volume) is less than 100 nm, optionally less than 50 nm, optionally less than 20 nm.

In an embodiment, the additional layer 1 comprises molybdenum or tungsten. In a particular embodiment, the target material comprises a-Si, the additional layer comprises molybdenum or tungsten and fluence provided by a single pulse of the radiation beam is in the range of 50-125 mJcm$^{-2}$ (corresponding to Fluence Regime II), optionally 70-110 mJcm$^{-2}$. In this embodiment the electrons energised in the target material when heated by the radiation transmitted through the additional layer couples to the lattice in a shorter time frame than that which occurs for electrons in the additional layer. In other materials such transmitted radiation may be absorbed by multiphoton or avalanche absorption, leading to rapid heating in ceramic materials such as metal oxides.

We claim:

1. A method of processing a target material, comprising:
   irradiating a multilayer structure with a radiation beam, the multilayer structure comprising at least a target layer comprising the target material and an additional layer not comprising the target material, wherein:
   the additional layer is metallic;
   the target layer is irradiated through the additional layer during the irradiation of the multilayer structure;
   the radiation beam passes partially through the additional layer to the target layer during the irradiation of the multilayer structure, such that the radiation beam transfers energy to the target layer and the additional layer by depositing energy both in the target layer and in the additional layer; and
   the transfer of energy from the radiation beam to the target layer and to the additional layer is such as to cause a thermally-induced change in the target layer, the thermally-induced change comprising crystal growth in the target material.

2. The method of claim 1, wherein a fluence of the radiation beam is selected such that the thermally-induced change is achieved without any portion of the target layer entering a molten phase during the irradiation by the radiation beam.

3. The method of claim 1, wherein a fluence of the radiation beam is selected such that at least a portion of the target layer enters a molten state during at least a portion of the irradiation by the radiation beam.

4. The method of claim 1, wherein the additional layer has a thickness of less than 200 nm.

5. The method of claim 1, wherein the irradiation of the multilayer structure causes detachment of at least an irradiated portion of the additional layer from the target layer after the thermally-induced change in the target layer has occurred.

6. The method of claim 1, wherein the radiation beam is a pulsed laser beam.

7. The method of claim 6, wherein a single pulse of the radiation beam causes crystal growth in the target material.

8. The method of claim 6, wherein a pulse duration of the pulsed laser beam is less than 1 ns.

9. The method of claim 6, wherein the pulsed laser beam comprises IR or visible radiation.

10. The method of claim 6, wherein a plurality of pulses are applied to each region of the target material where crystal growth is to be promoted, wherein, in each said region, a first pulse of the plurality of pulses causes crystal growth and a later pulse of the plurality of pulses causes further crystal growth.

11. The method of claim 1, wherein the target material comprises amorphous silicon.

12. The method of claim 1, wherein the target material comprises a transparent conductive material.

13. The method of claim 1, wherein the target material comprises indium gallium zinc oxide.

14. The method of claim 1, wherein the target material comprises a dielectric material.

15. The method of claim 1, wherein the target material comprises a metal or metal oxide.

16. The method of claim 1, wherein the additional layer comprises molybdenum or tungsten.

17. The method of claim 1, wherein the target material comprises amorphous silicon, the additional layer comprises molybdenum or tungsten and fluence provided by a single pulse of the radiation beam is in the range of 50-125 mJcm$^{-2}$.

* * * * *